US010756028B2

(12) United States Patent
Lee et al.

(10) Patent No.: US 10,756,028 B2
(45) Date of Patent: Aug. 25, 2020

(54) RADIATION-TOLERANT UNIT MOSFET HARDENED AGAINST SINGLE EVENT EFFECT AND TOTAL IONIZING DOSE EFFECT

(71) Applicant: Korea Advanced Institute of Science and Technology, Daejeon (KR)

(72) Inventors: Hee Chul Lee, Daejeon (KR); Young Tak Roh, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 55 days.

(21) Appl. No.: 16/123,930

(22) Filed: Sep. 6, 2018

(65) Prior Publication Data
US 2019/0287923 A1    Sep. 19, 2019

(30) Foreign Application Priority Data

Mar. 15, 2018 (KR) .................. 10-2018-0029994
Jul. 12, 2018 (KR) .................. 10-2018-0080899

(51) Int. Cl.
*H01L 23/556* (2006.01)
*H01L 29/08* (2006.01)
*H01L 29/10* (2006.01)
*H01L 29/78* (2006.01)

(52) U.S. Cl.
CPC ........ *H01L 23/556* (2013.01); *H01L 29/0847* (2013.01); *H01L 29/1083* (2013.01); *H01L 29/1095* (2013.01); *H01L 29/7832* (2013.01)

(58) Field of Classification Search
None
See application file for complete search history.

(56) References Cited

U.S. PATENT DOCUMENTS

| 6,455,894 | B1* | 9/2002 | Matsumoto | ............. H01L 21/84 257/347 |
| 8,907,380 | B1* | 12/2014 | Lee | ..................... H01L 29/4238 257/194 |
| 2013/0105904 | A1 | 5/2013 | Roybal et al. | |
| 2019/0312102 | A1* | 10/2019 | Lee | ..................... H01L 29/7851 |

OTHER PUBLICATIONS

Extended European Search Report dated Mar. 27, 2019, issued in corresponding European Application No. 18194288.9, 9 pages.
Roh, Y.T., and H.C. Lee, "TID and SEE Hardened n-MOSFET Layout on a Bulk Silicon Substrate Which Combines a DGA n-MOSFET and a Guard Drain," 2015 IEEE Nuclear Science Symposium and Medical Imaging Conference (NCC/MIC), Oct. 31-Nov. 7, 2015, San Diego, 4 pages.

* cited by examiner

*Primary Examiner* — Thien F Tran
(74) *Attorney, Agent, or Firm* — Christensen O'Connor Johnson Kindness PLLC

(57) ABSTRACT

Provided is a radiation-tolerant unit MOSFET to block a leakage current path caused by a total ionizing dose effect and reduce influence of a current pulse generated due to a single event effect. The radiation-tolerant unit MOSFET includes a poly gate layer for designating a gate region and at least one dummy gate region, a source and a drain, and a P+ layer and a P-active layer for specifying a P+ region to the source and the drain, and a dummy drain allowing application of a voltage. An electronic part that may normally operate is provided even a radiation environment where particle radiation and electromagnetic radiation are present.

15 Claims, 24 Drawing Sheets

RADIATION-TOLERANT UNIT MOSFET HARDENED AGAINST SINGLE EVENT EFFECT AND TOTAL IONIZING DOSE EFFECT

CROSS-REFERENCES TO RELATED APPLICATIONS

A claim for priority under 35 U.S.C. § 119 is made to Korean Patent Application No. 10-2018-0029994 filed on Mar. 15, 2018 and No. 10-2018-0080899 filed on Jul. 12, 2018, in the Korean Intellectual Property Office, the entire contents of which are hereby incorporated by reference.

BACKGROUND

Embodiments of the inventive concepts described herein relate to radiation-tolerant unit metal-oxide field-effect transistors (MOSFETs) and more particularly, relate to unit MOSFETs having radiation-tolerant characteristics hardened against single event effects and total ionizing dose effects.

Radiation is referred to the flow of energy emitted from atomic or molecular components when the atomic or molecular components are unstable at higher energy levels. The radiation is represented in the radiation form of an X-ray, a gamma ray, an alpha ray, a beta ray, neutrons, or protons. The radiations are classified into a particle form or an electromagnetic-wave form. The particle form is referred to a particle radiation, and the electromagnetic-wave form is referred to as an electromagnetic-wave radiation. Although the radiations are different from each other, the intensity of the radiation or the influence exerted on an object may be estimated, based on the basic concept of energy flow, depending on the size of an amount of transmitted energy or the size of an amount of absorbed energy.

The radiation may be incident to produce ions, which is called "ionizing radiation", and other radiations are called "specific ionizing radiations". In particular, the ionizing radiation causes the damage to a unit MOSFET constituting an electronic part by ionizing atoms of a semiconductor material of the unit MOSFET. Accordingly, the ionizing radiation does not ensure a normal operation of the electronic part and temporarily or permanently damages the electronic part.

FIG. 1 is a view illustrating the configuration of a typical unit MOSFET.

Referring to FIG. 1, the typical unit MOSFET includes a gate to control the operation of the transistor, a drain and a source through which a current flows by the gate, and a body. The thickness of an oxide film of the transistor is 10 nm or more. In this case, when an ionizing radiation is incident to a part having an electromagnetic field, holes may be trapped in the boundary surface between the oxide film and silicon. When the ionizing radiation is incident in the state that a voltage is applied to the gate, the hole trapping is caused at the boundary surface between the drain and the source and thus channel inversion occurs, thereby forming a leakage current path that the current flows. The leakage current path formed by the ionizing radiation causes the abnormal operation of the unit MOSFET. This phenomenon is called "Total Ionizing Dose Effect".

A PN junction is made between the drain/source and the body of the unit MOSFET. When the ionizing radiation is incident to a part of the PN junction, which is applied with a reverse bias of applying a positive voltage to an N-type part of the PN junction and of applying a negative voltage to a P-type part of the PN junction, electron-hole pairs are produced, electrons and holes move by an electronic field formed by the reverse bias, and thus current pulses flow toward the drain/source and toward the body, respectively. In general, in the state that the reverse bias are applied to the PN junction, the built-in potential becomes greater than potential in an equilibrium state, and thus carriers does not move in an opposite region. Accordingly, a current does not flow. A current pulse, which is produced as the radiation is incident, may affect a circuit including a unit MOSFET, and thus may modulate stored data, which is called a single event effect.

Due to the total ionizing dose effect and the single event effect, the normal operation of the unit MOSFET is not ensured under the radiation environment. In addition, a circuit or a system including such a unit MOSFET may abnormally operate under the radiation environment.

The unit MOSFET employing a dummy gate illustrated in FIG. 3, which serves as a radiation-tolerant unit device, blocks a leakage current path, which is produced due to the total ionizing dose effect, by employing a dummy poly gate layer, a P-active layer, a P+ layer, a dummy metal-1 layer.

In other words, a conventional unit MOSFET using a dummy gate include a dummy poly gate layer for blocking a leakage current path using a phenomenon that hole trapping is not caused when the thickness of an oxide film of a transistor gate is 10 nm or less, and a P-active layer and a P+ layer for blocking a leakage current by preventing channel inversion to be caused by holes trapped by increasing a threshold voltage, in addition to a unit MOSFET including an N-active layer for designating an active region of a transistor such that an isolation field oxide is not produced at a relevant position during process, a poly gate layer for designating a gate region of a transistor by using poly silicon, and an N+ layer for designating an N-type doping position to create a source and a drain in a self-align scheme. In this configuration, the source and the drain of the transistor are surrounded by the dummy poly gate layer, the P-active layer, and the P+ active layer, thereby blocking the leakage current path caused by the radiation.

However, the configuration may minimize only the total ionizing doze effect. When the single event effect occurs, the generated current pulse may affect a circuit.

PRIOR ART (Patent Document 01) U.S. Pat. No. 8,907,380B1
(Patent Document 02) Korean Patent Publication No. 10-1492807
(Patent Document 03) Korean Patent Publication No. 10-1494808
(Cited Reference 01) "Dummy Gate-Assisted n-MOSFET Layout for a Radiation-Tolerant Integrated Circuit", Min Su Lee and Hee Chul Lee, IEEE Transactions on Nuclear Science, 60(4), 3084-3091, 2013
(Cited Reference 02) "TID and SEE Hardened n-MOSFET Layout on a Bulk Silicon Substrate which Combines a DGA n-MOSFET and a Guard Drain", in Proc. 2015 IEEE Nuclear Science Symposium and Medical Imaging Conference (NSS/MIC), DOI: 10.1109/NSSMIC.2015.7581808, 2015

SUMMARY

Embodiments of the inventive concepts provide a radiation-tolerant unit MOSFET, capable of preventing a leakage current path to be caused by a total ionizing dose effect through a unit MOSFET.

Embodiments of the inventive concepts provide a radiation-tolerant unit MOSFET, capable of minimizing an influence caused as a current pulse generated due to a single event effect flows through a circuit including a drain or a source.

One aspect of embodiments of the inventive concept is directed to a radiation-tolerant unit MOSFET for reducing an influence of a current pulse generated due to a single event effect, the radiation-tolerant MOSFET includes a poly gate layer for designating a gate region and at least one dummy gate region, a source and a drain, and a dummy drain allowing application of a voltage.

The dummy drain may distribute flow of electrons and holes produced by incident radiation.

The dummy drain may be connected with the poly gate layer and is positioned in each or both of lateral sides of the source and the drain.

The dummy drain may be positioned at a top or a bottom of the source and/or the drain.

According to an embodiment of the inventive concept, the radiation-tolerant unit MOSFET may further include an N-well layer spaced apart from the dummy drain by a specific distance.

The N-well layer may be formed in length including lengths of the source and the drain and the dummy drain.

The radiation-tolerant unit MOSFET may further include an N-well/Metal-1 via configured to separately apply a voltage to the N-well layer.

The N-well/Metal-1 via may be positioned at each of overlapped regions with a plurality of the N-well layers formed at outer portions of the radiation-tolerant unit MOSFET.

In addition, according to an embodiment of the inventive concept, the radiation-tolerant unit MOSFET may further include a deep N-well layer formed under the N-well layer.

The deep N-well layer may be formed under the N-well layer, the source and the drain, and the dummy drain and may be formed in length to cover N-well layers positioned at both sides of the gate region.

The radiation-tolerant MOSFET may distribute or block a current pulse generated due to the single event effect and flowing through the source and the drain of the transistor by using the N-well layer and the deep N-well layer positioned under the N-well layer.

The radiation-tolerant MOSFET may further include a depletion region formed between the deep N-well layer, and the dummy drain and the source and the drain of the transistor, and he depletion region may has a width adjusted by a voltage applied to the N-well layer.

The radiation-tolerant MOSFET may be formed through a layout modification technique.

The radiation-tolerant MOSFET may be implemented with a P-type metal oxide semiconductor (PMOS) including a PMOS gate electrode pattern or an N-type metal oxide semiconductor (NMOS) including an NMOS gate electrode pattern.

Another aspect of embodiments of the inventive concept is directed to a radiation-tolerant unit MOSFET including a poly gate layer for designating a gate region, an N+ layer for producing a source and a drain of a transistor, a dummy poly gate layer for blocking a leakage current path, and a P-active layer and a P+ layer for blocking a leakage current, to reduce an influence of a current pulse generated due to a single event effect. The radiation-tolerant MOSFET may include a dummy drain (DD) allowing application of a voltage to the transistor.

The DD may make contact with an outside of the P+ layer and an inner side of the P-active layer, and may be positioned at a top or a bottom of the source and the drain.

The radiation-tolerant MOSFET may distribute or block a current pulse generated due to the single event effect and flowing through the source and the drain by a deep N-well layer positioned under an N-well layer formed to be spaced apart from the radiation-tolerant MOSFET including the DD by a specific distance.

The radiation-tolerant MOSFET may be implemented with an NMOS including an NMOS gate electrode pattern or a PMOS including a PMOS gate electrode pattern.

DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
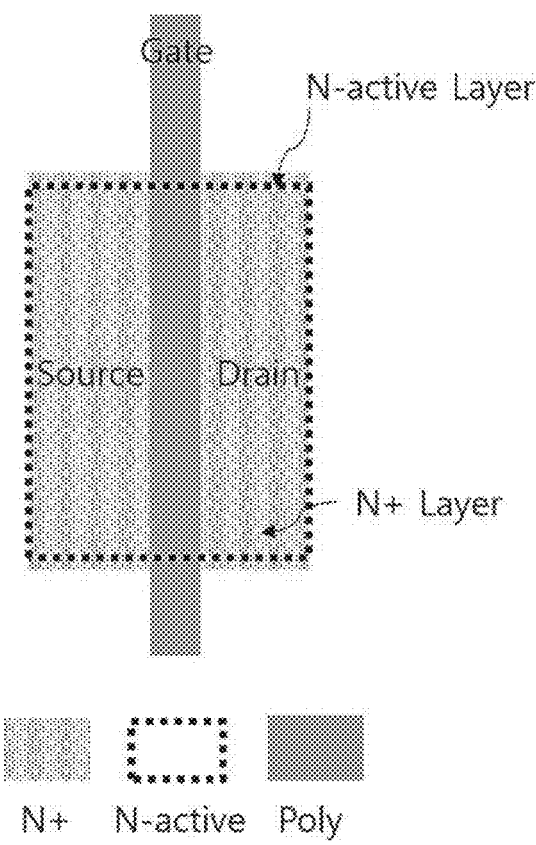
FIG. 1 is a view illustrating the layout of a conventional commercial unit n-MOSFET.

Hereinafter, an exemplary embodiment of the inventive concept will be described in detail with reference to accompanying drawings. However, in the following description of the inventive concept, a detailed description of well-known features or functions will be ruled out in order not to unnecessarily obscure the gist of the inventive concept. In addition, it should be noticed that the same components are assigned with the same reference numerals throughout the whole accompanying drawings.

Terms and words used in the present specification and the claims shall not be interpreted as commonly-used dictionary meanings, but shall be interpreted as to be relevant to the technical scope of the invention based on the fact that the inventor may properly define the concept of the terms to explain the invention in best ways.

Therefore, the embodiments and the configurations depicted in the drawings are illustrative purposes only and do not represent all technical scopes of the embodiments, so it should be understood that various equivalents and modifications may exist at the time of filing this application.

Some components in the accompanying drawings may be exaggerated, omitted or schematically drawn for the purpose of convenience or clarity. In addition, the size of each component does not utterly reflect an actual size. Accordingly, the inventive concept is not limited to the relative size or gap shown in accompanying drawings.

In the following description, when a certain part "includes" a certain component, the certain part does not exclude other components, but may further include other components if there is a specific opposite description. When a certain part is "linked to", "coupled to", or "connected with" another part, the certain part may be directly linked to or connected with the another part, and a third part may be electrically "linked", "coupled", or "connected" between the certain part and the another part.

The singular expression includes a plural expression, unless the context clearly indicates otherwise. It will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

Hereinafter, the embodiment of the inventive concept will be described in detail with reference to accompanying drawings to allow those skilled in the art to easily reproduce the inventive concept. However, the inventive concept may be implemented in various forms, and is limited to embodiments described herein. In addition, to clearly describe the inventive concept, part, which is irrelevant to the description, is omitted and similar reference numerals will be assigned to similar parts throughout the whole specification.

Hereinafter, the principle of the inventive concept will be described in brief before embodiments of the inventive concept are described.

FIG. 1 is a view illustrating the layout of a conventional commercial unit n-channel metal-oxide field-effect transistor (n-MOSFET).

Referring to FIG. 1, the conventional commercial unit n-MOSFET has the layout formed by using an N-active layer, a poly gate, and an N+ layer, a P+ layer.

The layers may play the following roles.

The N-active layer is to designate an active region of a transistor such that an isolation field oxide is not produced in a relevant region during process. The poly gate layer is to designate a gate region by forming a gate oxide layer and a poly silicon layer in a region. The N+ layer is a layer designated with a higher N-type doping concentration to create a source and a drain in a self-align scheme. The P+ layer is a layer designated with a higher P-type doping concentration to create a body of an N-type unit MOSFET (n-MOSFET).

Hereinafter, the brief description will be made regarding the reason that a method of the inventive concept is suggested based on a radiation-tolerant dummy gate assisted n-MOSFET (DGA n-MOSFET).

Figure 2:
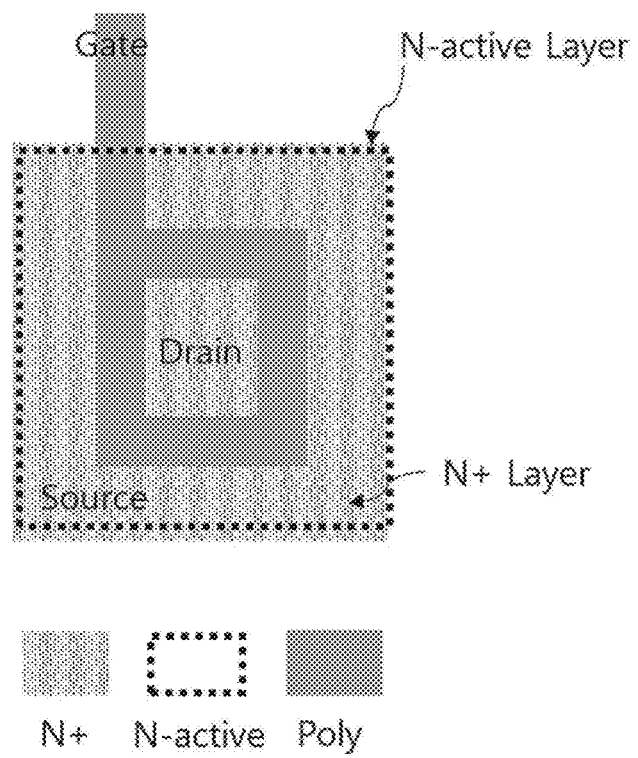
FIG. 2 is a view illustrating the layout of an ELT structure suggested according to the related art.
Figure 3:
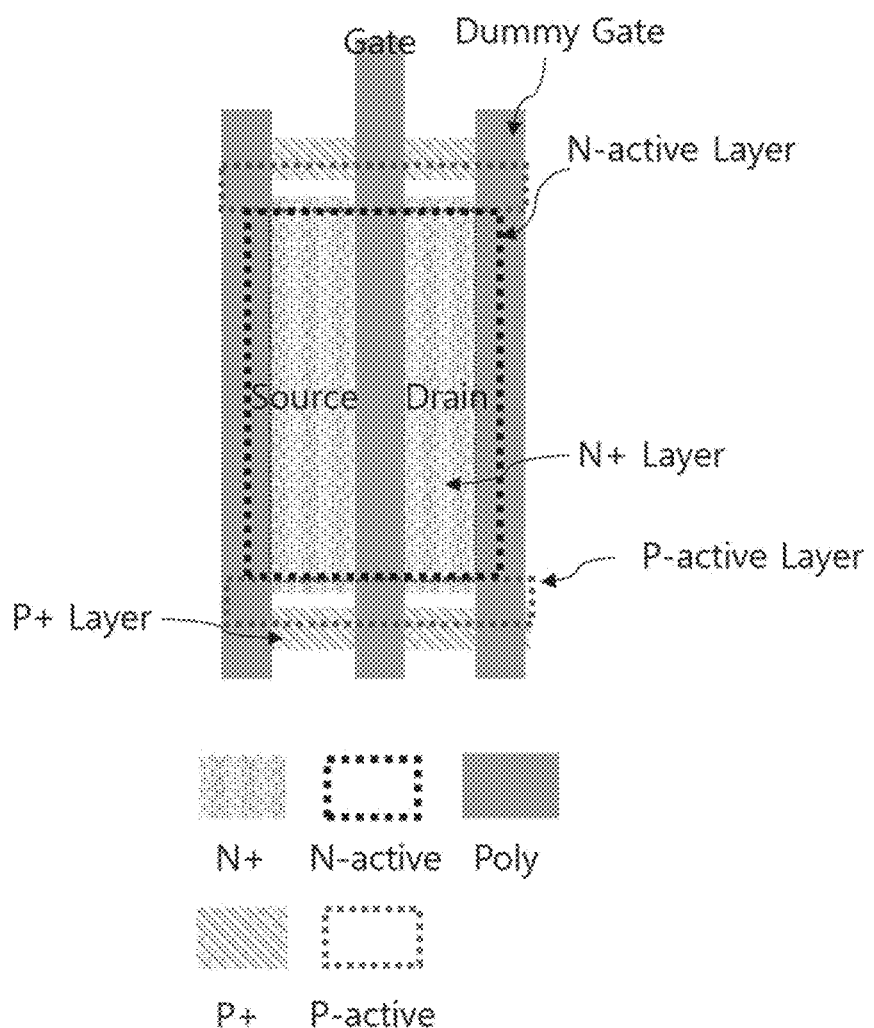
FIG. 3 is a view illustrating the layout of a conventional radiation-tolerant DGA n-MOSFET.

FIG. 2 is a view illustrating the layout of an enclosed layout transistor (ELT) structure suggested according to the related art, and FIG. 3 is a view illustrating the layout of a conventional radiation-tolerant DGA n-MOSFET.

The ELT illustrated in FIG. 2 has the structure in which a gate surrounds a source. Accordingly, the width over length ratio of 2.26 or less may not be implemented, and the structure shows an asymmetric characteristic in that the source and the drain are different from each other in size.

In contrast, the conventional radiation-tolerant DGA n-MOSFET of FIG. 3 allows the implementation of the width over length ratio of 2.26 or less that may be required in the design of a circuit and has a characteristic in which a source and a drain are symmetrical to each other about a gate. The conventional radiation-tolerant DGA n-MOSFET illustrated in FIG. 3 may have a problem in that a current pulse is generated due to a single event effect.

To minimize the single event effect caused in the conventional DGA n-MOSFET as described above, according to the inventive concept, all or part of a dummy drain (DD), an N-well layer (NW), and a deep N-well layer (DNW) are selectively added.

Due to the added layers, a radiation-tolerant unit MOSFET according to an embodiment of the inventive concept may reduce a single event current pulse flowing through a drain/a source by radiation.

Although the following description of an embodiment of the inventive concept will be made regarding the radiation-tolerant unit MOSFET classified as an NMOS having a source and a drain, which are N-type semiconductor regions, and a substrate which is a P-type semiconductor region, that is, an NMOS gate electrode pattern, the inventive concept is not limited to the NMOS. For example, the radiation-tolerant unit MOSFET may be implemented in the form of a PMOS (e.g., the source and the drain are P-type semiconductor regions and the substrate is N-type semiconductor region) having a PMOS gate electrode pattern.

Figure 4:
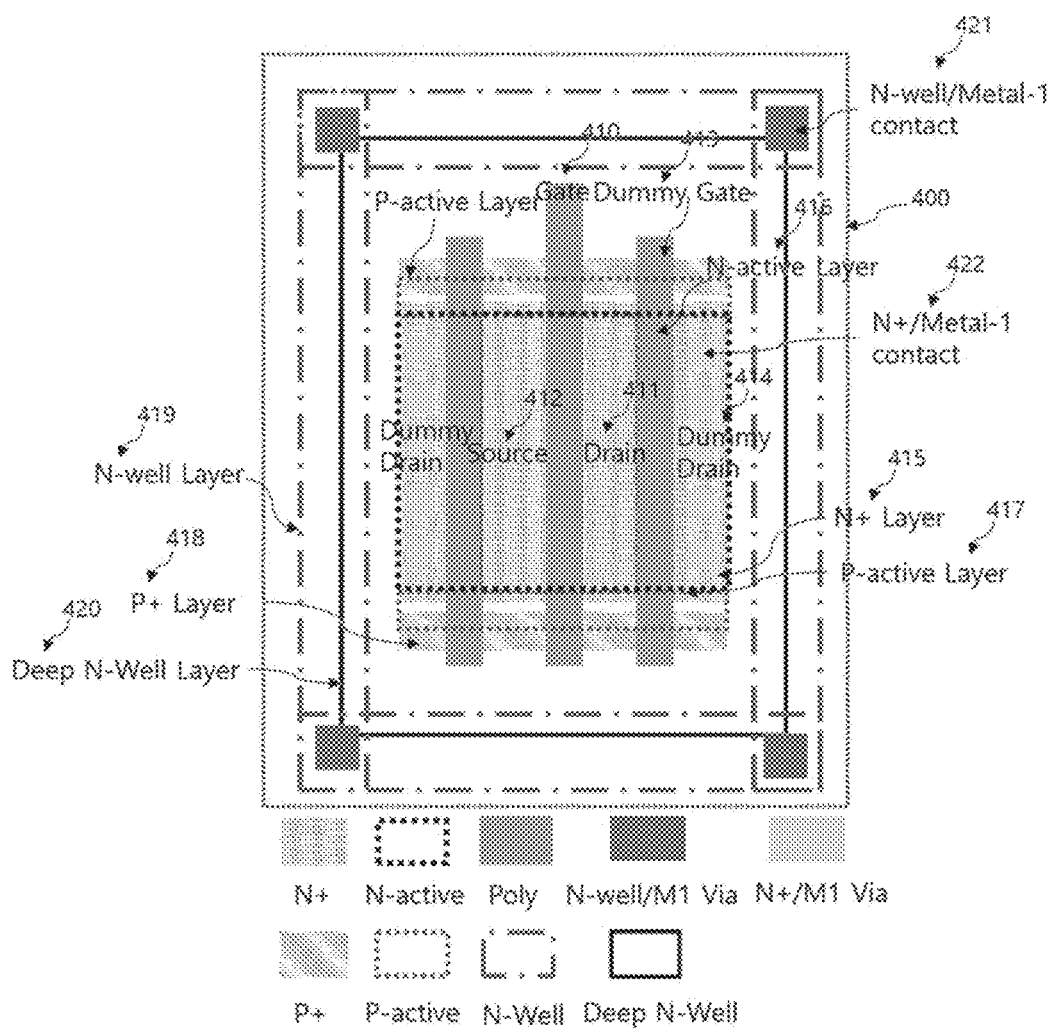
FIG. 4 is a view illustrating the layout of a radiation-tolerant unit MOSFET according to an embodiment of the inventive concept.
Figure 5:
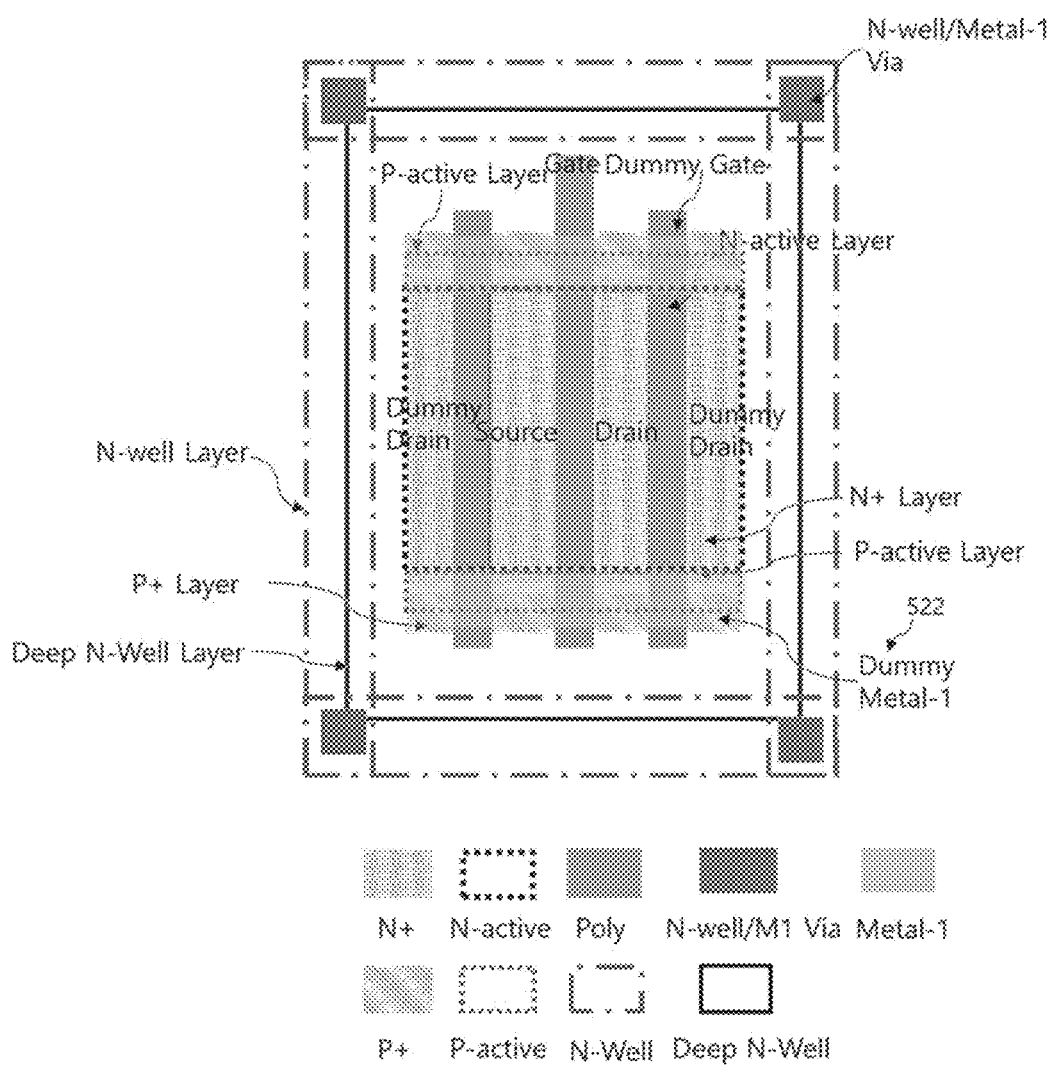
FIG. 5 is a view illustrating the layout of the radiation-tolerant unit MOSFET according to an embodiment of the inventive concept.

FIG. 4 is a view illustrating the layout of the radiation-tolerant unit MOSFET according to an embodiment of the inventive concept, and FIG. 5 is a view illustrating the layout of the radiation-tolerant unit MOSFET according to an embodiment of the inventive concept.

In more detail, the configuration of FIG. 5 is made by adding a dummy metal-1 522 to an upper portion of a P+ layer 418 in the configuration of FIG. 4.

Radiation-tolerant unit MOSFETs 400 of FIGS. 4 and 5 may further include dummy drains 414 connected with a dummy gate 413 at the left and right sides of the dummy gate 413. In addition, the radiation-tolerant unit MOSFET 400 including the dummy drains 414 includes an N-well layer 419 formed along an outer circumference of the radiation-tolerant unit MOSFET 400 while being spaced apart from the outer circumference by a specific distance, and a deep N-well layer 420 formed under the N-well layer 419.

Figure 7A:
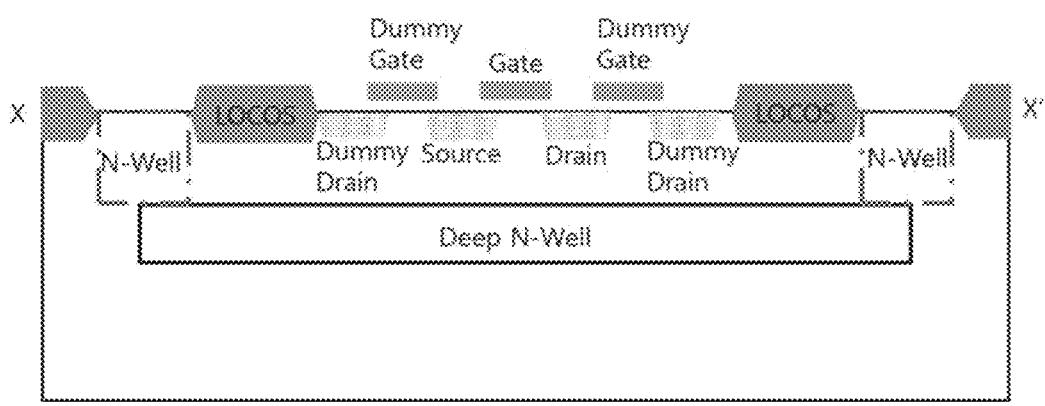
FIGS. 7A and 7B are sectional views taken along lines X-X' and Y-Y' from FIG. 6.
Figure 7B:
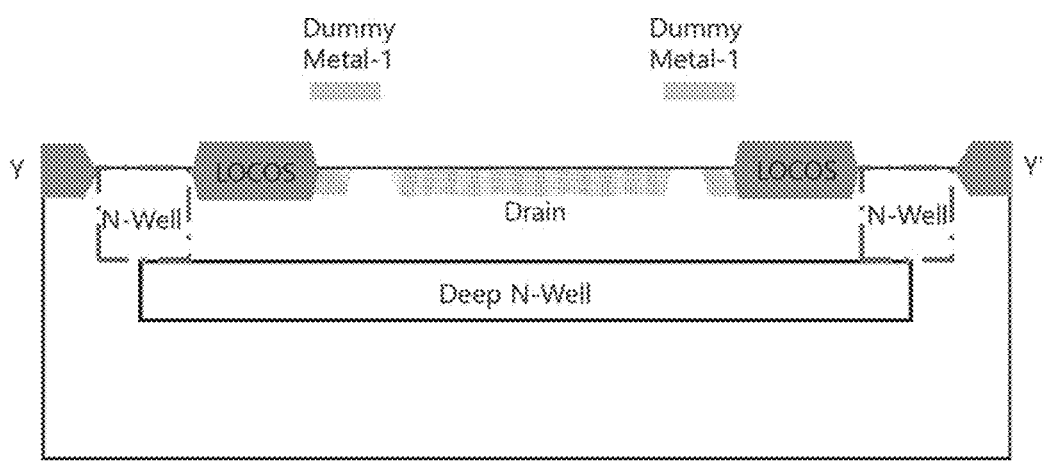

Through the above configuration, as illustrated in FIGS. 7A and 7B, the N-well layer 419 and the deep N-well layer 420 are configured to surround the side surface and the bottom surface of the radiation-tolerant unit MOSFET 400.

Referring to FIGS. 4 and 5, according to an embodiment of the inventive concept, the dummy drains 414 of the radiation-tolerant unit MOSFET 400 are positioned at the sides of the drain 411 and the source 412 of the transistor, respectively, to be applied with separate voltages.

According to an embodiment, the dummy drains 414 may be positioned over or under the source 412 and the drain 411, or may be positioned at both sides or only at one side of the source 412 and the drain 411. For example, a single dummy drain 414 or multiple dummy drains 414 may be formed on at least one of a top of the source 412, a bottom of the source 412, a top of the drain 411, and a bottom of the drain 411. In addition, as illustrated in FIG. 4, a single dummy drain 414 or multiple dummy drains 414 may be formed on a right side of the drain 411 and a left side of the source 412.

In other words, according to an embodiment of the inventive concept, in the case of the radiation-tolerant unit MOSFET 400, voltages are separately applied to the dummy drains 414 such that current pulses generated due to the single event effect are distributed and flow, thereby reducing current pulses flowing through the drain 411 and the source 412 connected with a circuit.

To this end, according to an embodiment of the inventive concept, the radiation-tolerant unit MOSFET 400 includes an N-active layer 416, an N+ layer 415, and an N+/Metal-1 contact(vias) 422.

In more detail, an electron hole pair produced due to the occurrence of the single event effect generates current pulses toward the drain 411/source 412 and toward the body due to the electromagnetic field formed by a reverse bias applied to a PN junction of the transistor. In contrast, according to an embodiment of the inventive concept, the radiation-tolerant unit MOSFET 400 allows current pulses generated by using the N-well layer 419 and the deep N-well layer 420 to flow to a side surface or a bottom surface, thereby distributing or blocking the path of a current, which is generated due to the single event effect and flows through the drain 411 and the source 412.

In addition, according to an embodiment of the inventive concept, the radiation-tolerant unit MOSFET 400 blocks a current from being generated and flowing in, due to the single event effect outside the N-well layer 419 or the deep N-well layer 420. In this case, according to an embodiment of the inventive concept, the radiation-tolerant MOSFET 400 includes the N-well layer 419, the deep N-well layer 420, and the N-well/Metal-1 via 421.

In this case, referring to FIG. 7A, the N-well layer 419 is positioned at the side of a local oxidation of silicon (LOCOS) region and may be formed at a depth including the lengths of the source 412 and the drain 411, and the dummy drain 414. In addition, referring to FIG. 7A, the deep N-well layer 420 may be formed under the N-well layer 419, the source 412 and the drain 411, and the dummy drain 414 and may be formed in length for covering the N-well layers 419 positioned at both sides of a gate region 410.

N-well/Metal-1 contact(vias) 421 may be configured to separately apply voltages to the N-well layers 419. As illustrated in FIGS. 4 and 5, according to an embodiment of the inventive concept, the N-well/Metal-1 vias 421 may be positioned at the overlapped regions with the N-well layers 419, which are formed at outer portions of the radiation-tolerant unit MOSFET 400.

According to an embodiment of the inventive concept, the radiation-tolerant unit MOSFET 400 may be designed through a layout modification technique to be hardened against the single event effect and the total ionizing dose effect.

The layout modification technique, which is to implement a radiation-tolerant characteristic by modifying only the layout of a transistor, may employ the latest commercial semiconductor manufacturing process, which has been already established, without change.

According to the inventive concept, the radiation-tolerant unit MOSFET 400 hardened against the single event effect and the total ionizing dose effect has the three following effects.

First, a current pulse is generated as electrons and holes flow toward the drain 411/source 412 and the body by the electromagnetic field formed due to the reverse bias applied to the PN junction of the transistor. In this case, according to an embodiment of the inventive concept, the radiation-tolerant unit MOSFET 400 employs dummy drains 414 allowing the application of voltages to the sides of the drain 411/source 412, thereby distributing and flowing a current flowing upward due to the single event effect to reduce a current flowing through the drain 411/source 412 connected with a real circuit.

According to an embodiment of the inventive concept, when the dummy drains 414 are positioned separately from an existing transistor by an isolation field oxide, the effects of the dummy drains are reduced. Therefore, the inventive concept is designed such that an active region is expanded through the N-active layer 416, the N+ layer 415 is used as the dummy drain 414, and a voltage is applied through an N+/Metal-1 via 422. Therefore, according to the inventive concept, as the current pulse generated due to the single event effect flows toward the dummy drain 414 positioned at the upper portion, the single event effect may be reduced.

Second, a PN junction is formed between the drain 411/source 412 of the transistor and a substrate. The depth in which electron hole pairs produced due to the single event effect are collected may be about three times of a depletion width in which the PN junction is formed. In this case, according to the inventive concept, the electron hole pairs produced near the substrate flow through the wall surface or the bottom surface, thereby reducing a current flowing through the drain 411/source 412.

According to an embodiment of the inventive concept, the radiation-tolerant unit MOSFET 400 applies the deep N-well layer 420 to the bottom surface of the transistor, and includes the structure and the form of surrounding a lateral side thereof using the N-well layer 419 such that the N-well layer 419 is linked to the deep N-well layer 420 provided on the bottom surface. In addition, voltages may be separately applied through the N-well/Metal-1 vias 421 such that the current pulses generated due to the single event effect flow to the lateral side and the bottom surface, thereby reducing the single event effect.

Third, the layout of the conventional radiation-tolerant DGA n-MOSFET is maintained or expanded, thereby blocking a leakage current path of the radiation-tolerant unit MOSFET 400 according to the inventive concept.

In more detail, in the case of a conventional unit MOSFET having the structure of a gate, a drain, and a source, a P-active layer and a P+ layer are disposed to raise a threshold voltage. Accordingly, even if the threshold voltage is lowered as hole trapping is caused due to the radiation, the threshold voltage is sufficiently compensated to block the leakage current path that may be generated between the drain and the source.

In addition, when the thickness of an oxide film is reduced to about 10 nm or less, hole trapping may be not caused. When the thickness of the oxide film is reduced, even if an electron hole pair is produced in the oxide film due to the radiation, a hole is out of the interface between the oxide film and the substrate through the tunneling without being trapped. Since the hole is not trapped as described above, the leak current is not caused due to the radiation. In addition, the leakage current path that may be formed between the dummy drain and the drain/source may be blocked due to the P-active layer and the P+ layer expanded to the dummy drain region.

Figure 6:
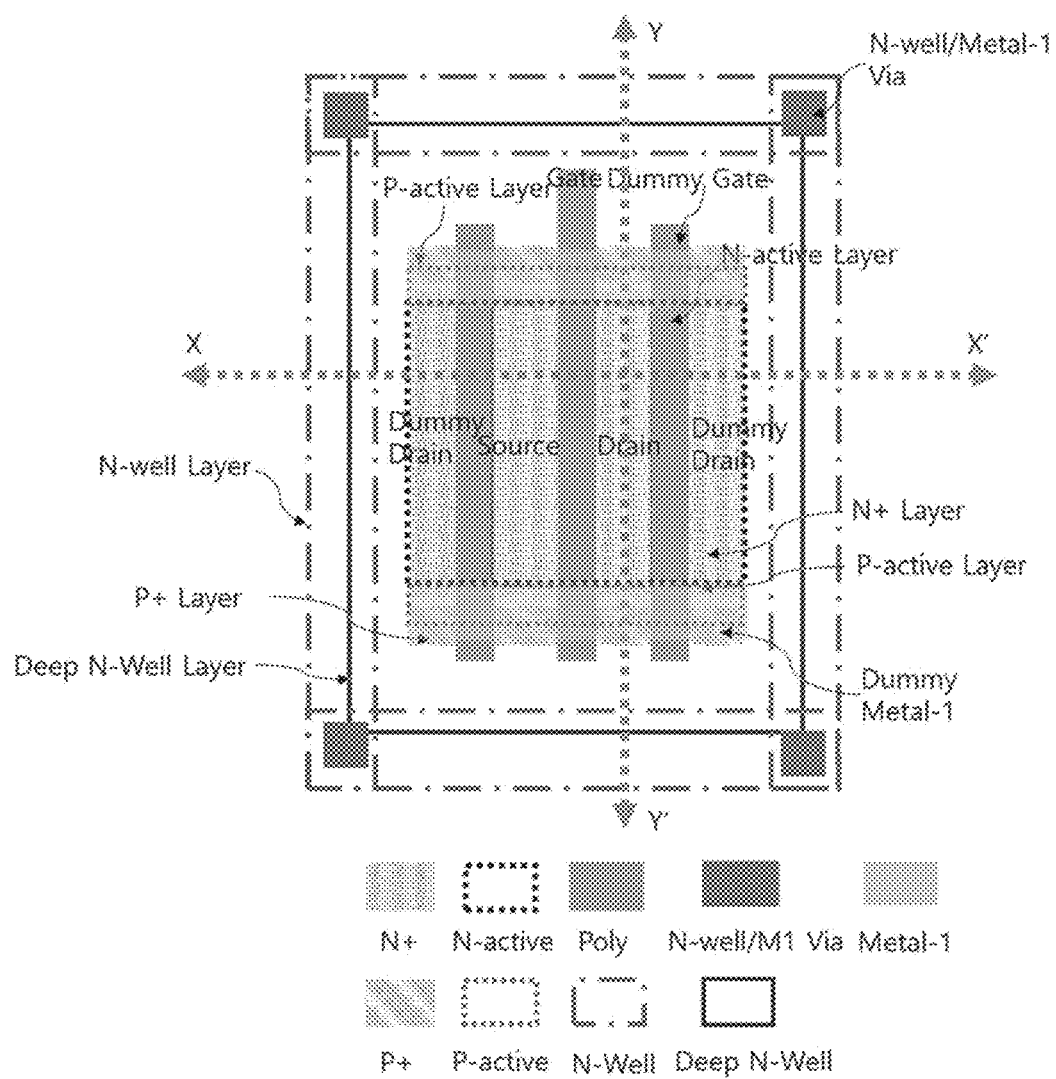
FIG. 6 is a view illustrating that virtual lines X-X' and Y-Y' are added to the layout of FIG. 5.

FIG. 6 is a view illustrating that virtual lines X-X' and Y-Y' are added to the layout of FIG. 5, and FIGS. 7A and 7B are sectional views taken along lines X-X' and Y-Y' of FIG. 6.

In more detail, FIG. 7A is a section view taken along line X-X' of FIG. 6, and FIG. 7B is a sectional view taken along line Y-Y' of FIG. 6. Further, FIGS. 7A and 7B are sectional views in the case of employing LOCOS for an isolation field oxide. Even if a shallow trench isolation (STI) scheme is substituted for the LOCOS for the isolation field oxide, the radiation-tolerant unit MOSFET hardened against the single event effect and the total ionizing dose effect may still have a radiation-tolerant characteristic.

Referring to FIG. 7A, according to an embodiment of the inventive concept, in the case of the radiation-tolerant unit MOSFET 400, electrons and holes produced by the radiation are dispersed and are blocked from being collected on the surface, by the dummy drains, the deep N-well layer, and the N-well layer.

In addition, in FIG. 7A, a depletion region may be present between the deep N-well layer and the dummy drains and the source/drain of the transistor. The width of the depletion region may be adjustable by a voltage applied to the deep N-well layer.

Hereinafter, various embodiments of the inventive concept will be described with reference to accompanying drawings. The following description will be made by employing, as Embodiment 1, the case that all the dummy drains 414, the deep N-well layer 420, and the N-well layer 419 are applied, by employing, as Embodiment 2, the case that only the dummy drain 414 is applied, by employing, as Embodiment 3, the case that the dummy drain 414 and the deep N-well layer 420 are applied, by employing, as Embodiment 4, the case that the dummy drain 414 and the N-well layer 419 are applied, and by employing, as Embodiment 5, the case that the dummy drain 414 is applied to the top or the bottom of the source and the drain.

Although the following description is made in limitation to an NMOS, the radiation-tolerant unit MOSFET according to an embodiment of the inventive concept may be naturally applied to not only the NMOS, but also a single MOS of the PMOS.

Embodiment 1

Figure 8:
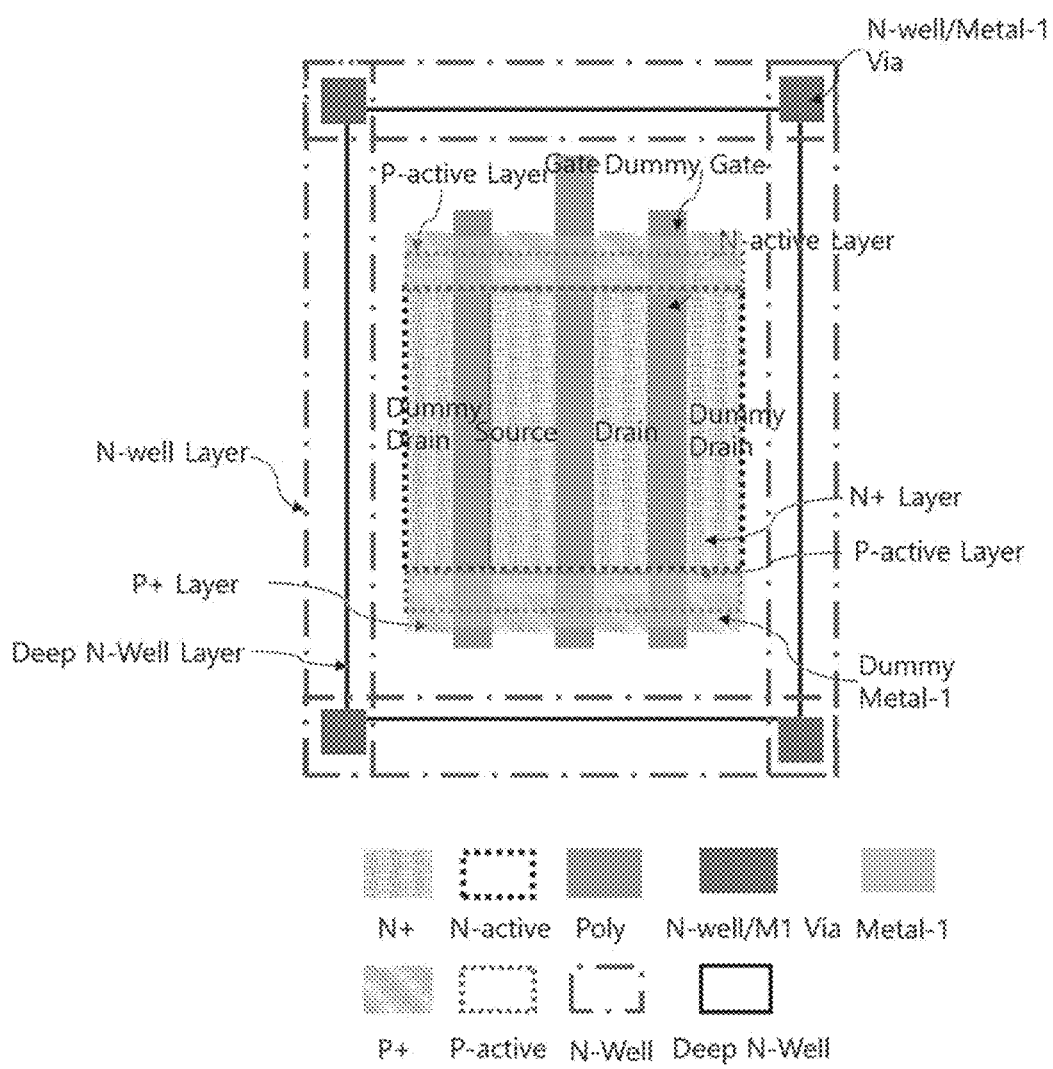
FIG. 8 is a view illustrating the layout of the radiation-tolerant unit MOSFET hardened against a single event effect and a total ionizing dose effect according to Embodiment of 1 of the inventive concept.

FIG. 8 is a view illustrating the layout of the radiation-tolerant unit MOSFET hardened against a single event effect and a total ionizing dose effect according to Embodiment of 1 of the inventive concept.

Referring to FIG. 8, in Embodiment 1, all a dummy drain (DD), a deep N-well layer (DNW), and an N-well layer (NW) are applied. In this case, current pulse generated due to the single event effect is shown in the least intensity as recognized through drain current (DGA NMOS with DD, NW, and DNW) marked in FIG. 16.

Embodiment 2

Figure 9:
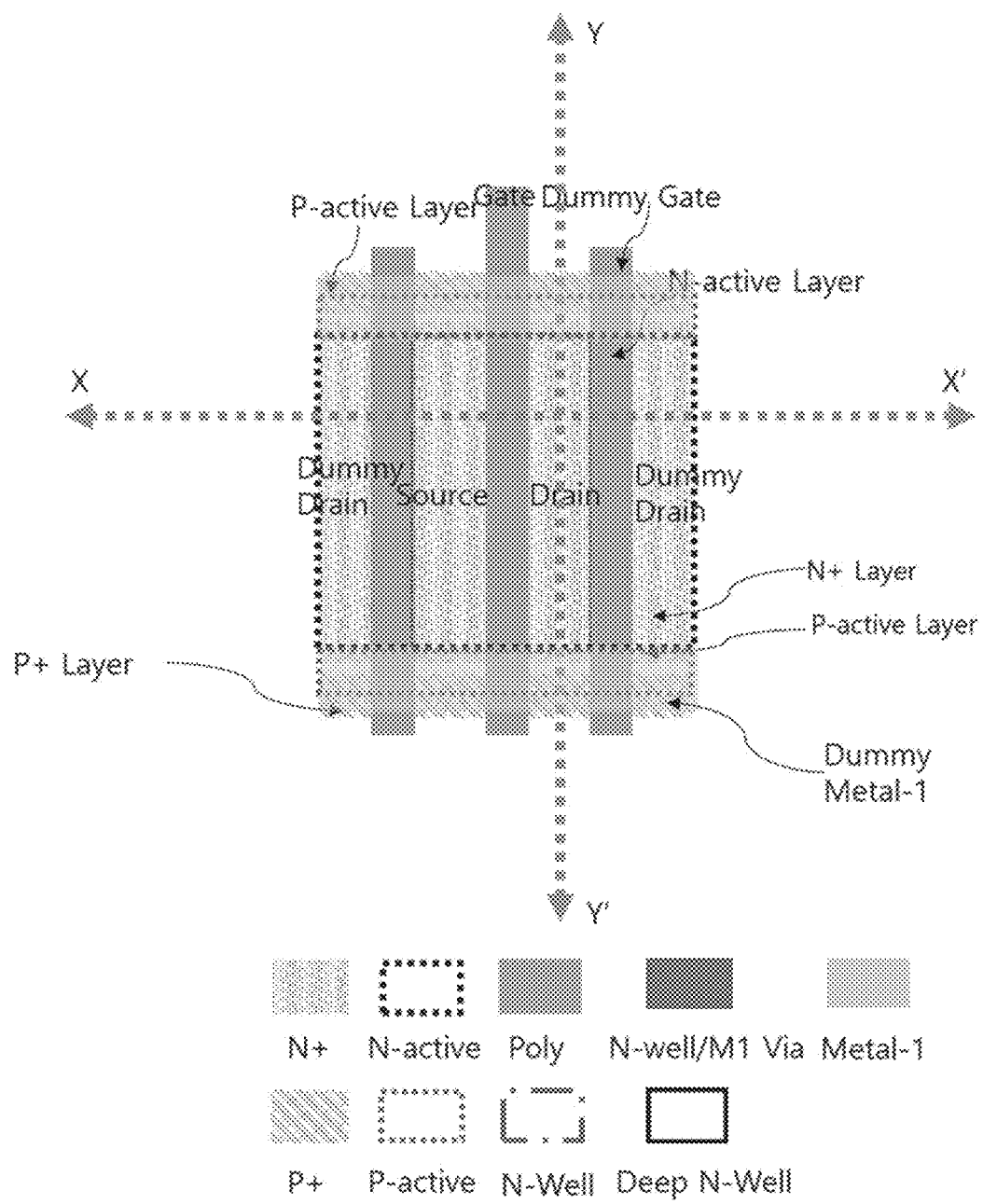
FIG. 9 is a view illustrating the layout of the radiation-tolerant unit MOSFET hardened against the single event effect and the total ionizing dose effect according to Embodiment 2 of the inventive concept.

FIG. 9 is a view illustrating the layout of the radiation-tolerant unit MOSFET hardened against a single event effect and a total ionizing dose effect according to Embodiment 2 of the inventive concept.

Figure 10A:
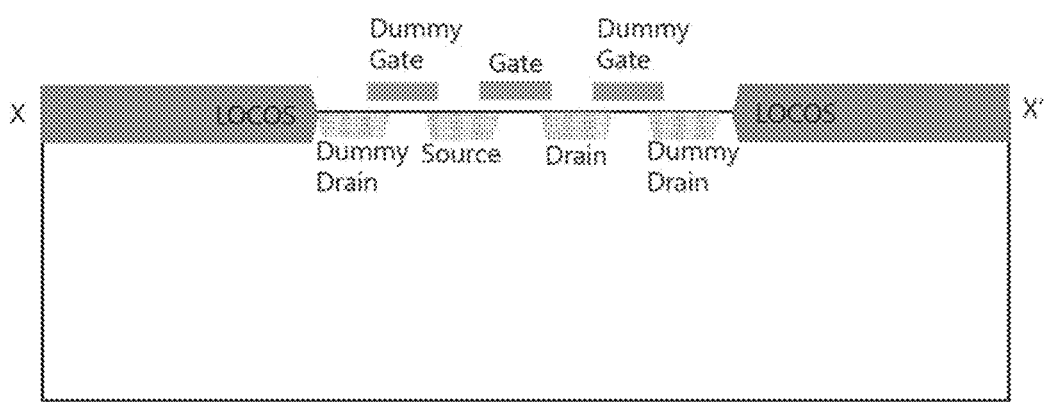
FIGS. 10A and 10B are sectional views taken along line X-X' and line Y-Y' of the layout of FIG. 9.
Figure 10B:
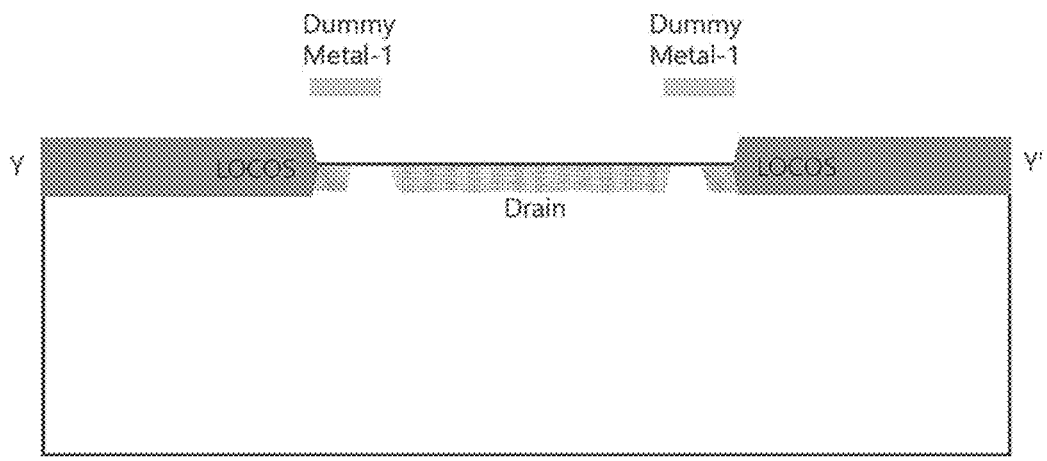

In addition, FIG. 10A is a sectional view taken along line X-X' of the layout of FIG. 9, and FIG. 10B is a sectional view taken along line Y-Y' of the layout of FIG. 9.

Referring to FIG. 9, in embodiment 2, only the DD is applied by using an N-active layer, an N+ layer, an N+/Metal-1 via part. This layout is implemented with a narrower area when compared with Embodiment 1. This layout may be used when the case such as Embodiment 1 violates a specific design rule for a commercial process, or when the deep N-well layer may not be used. In Embodiment 2, although the current pulse generated due to the single event effect is shown in the greater intensity when compared with that of another embodiment as recognized drain current (DGA NMOS with DD) marked in FIG. 16, but the current pulse generated due to the single event effect is significantly reduced when compared with a conventional configuration (drain current (conventional NMOS)).

Embodiment 3

Figure 11:
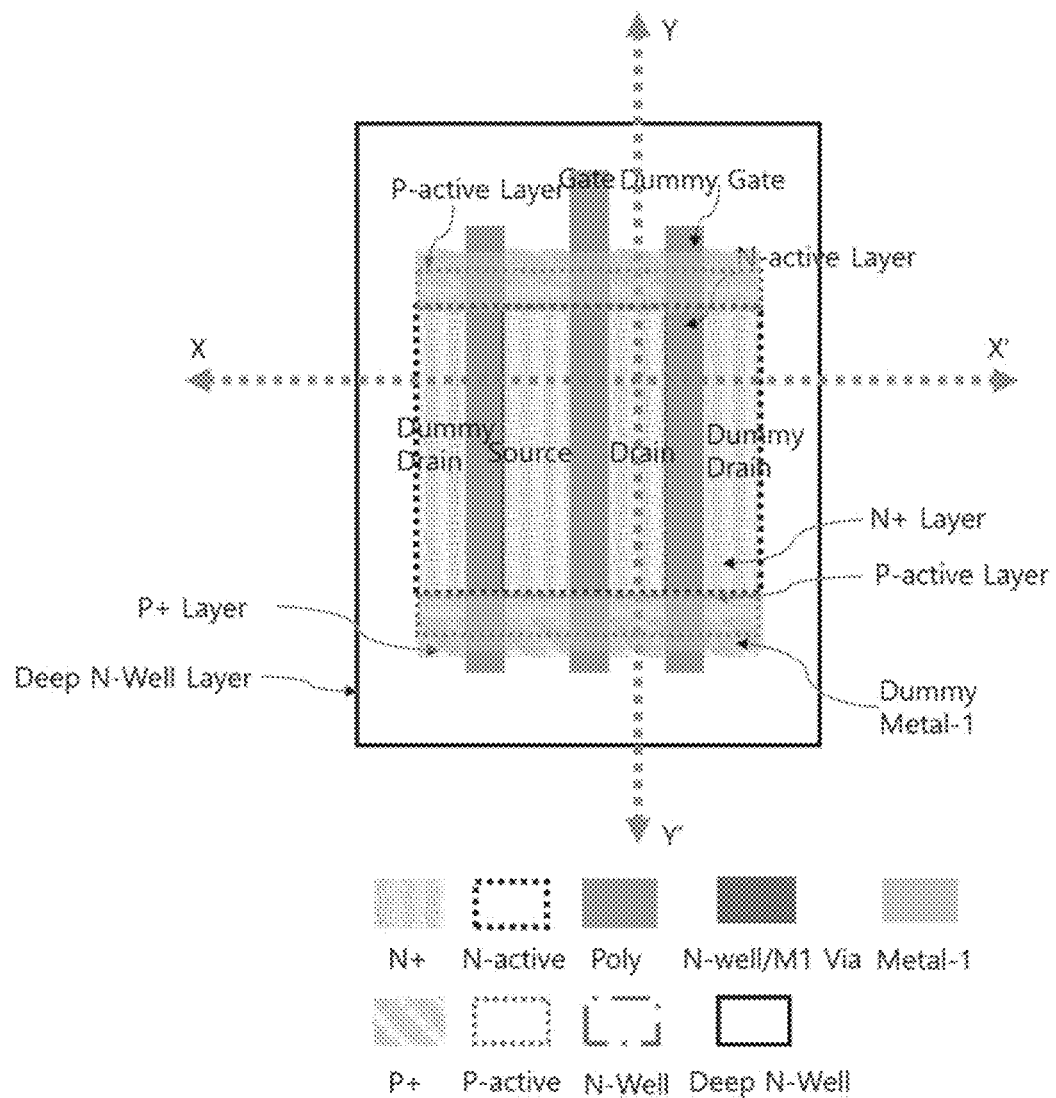
FIG. 11 is a view illustrating the layout of the radiation-tolerant unit MOSFET hardened against the single event effect and the total ionizing dose effect according to Embodiment 3 of the inventive concept.

FIG. 11 is a view illustrating the layout of the radiation-tolerant unit MOSFET hardened against a single event effect and a total ionizing dose effect according to Embodiment 3 of the inventive concept.

Figure 12A:
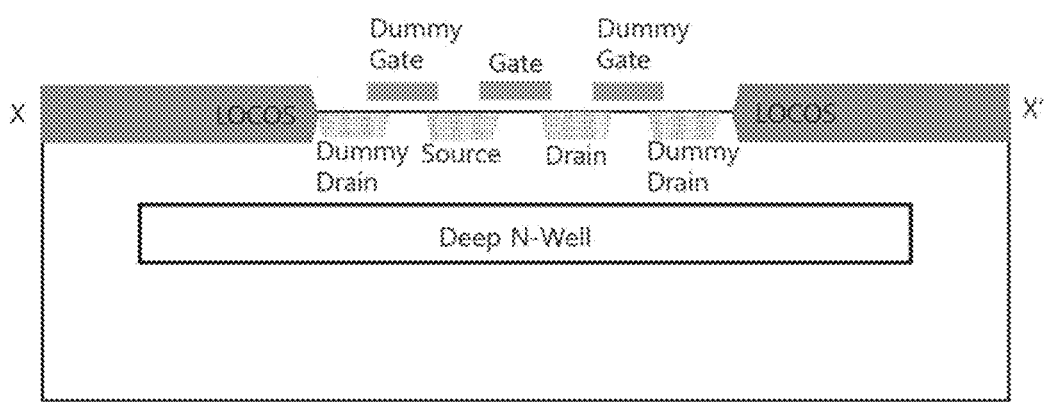
FIGS. 12A and 12B are sectional views taken along line X-X' and line Y-Y' of the layout of FIG. 11.
Figure 12B:
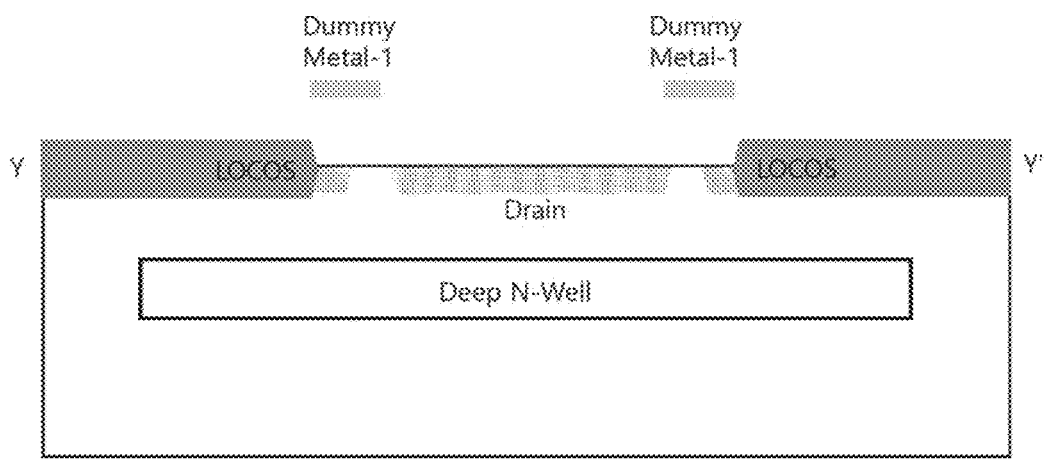

In addition, FIG. 12A is a sectional view taken along line X-X' of the layout of FIG. 11, and FIG. 12B is a sectional view taken along line Y-Y' of the layout of FIG. 11.

Referring to FIG. 11, Embodiment 3 is the case that only the DD and the DNW formed on the bottom surface are applied.

In more detail, although an NW does not surround the radiation-tolerant unit MOSFET according to an embodiment of the inventive concept, a DNW is disposed on the bottom surface. According to the structure of FIG. 11, since an additional voltage is not applied to the bottom surface due to the PN junction formed between the substrate and the DNW, the current pulse generated due to the single event effect does not flow through the bottom surface. However, electron hole pairs produced due to the single event effect are not collected in the lower portion of the DNW, thereby reducing the influence by the single event effect. When compared with Embodiment 1, this layout may be implemented with a narrower area. In addition, this layout is used when the case such as Embodiment 1 violates a specific design rule for a commercial process, or when the form that the DNW is added to the lateral side and surrounds the unit MOSFET is not used.

Figure 16:
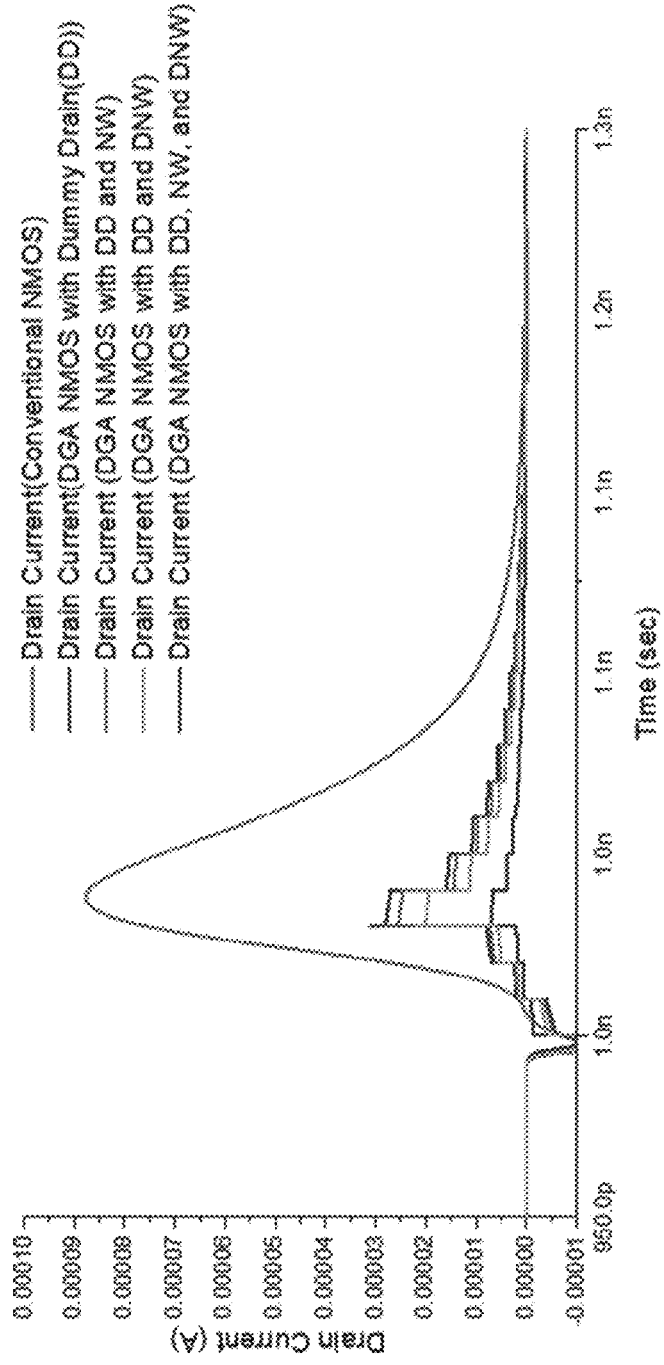
FIG. 16 is a graph illustrating waveforms of a drain current when radiation is applied to a conventional NMOS and an NMOS according to each embodiment.

In Embodiment 3, the current pulse generated due to the single event effect is shown in the greater intensity when compared with that of Embodiment 1, and is reduced when compared with that of another embodiment, as recognized through Drain Current (DGA NMOS with DD and DNW) marked in FIG. 16.

Embodiment 4

Figure 13:
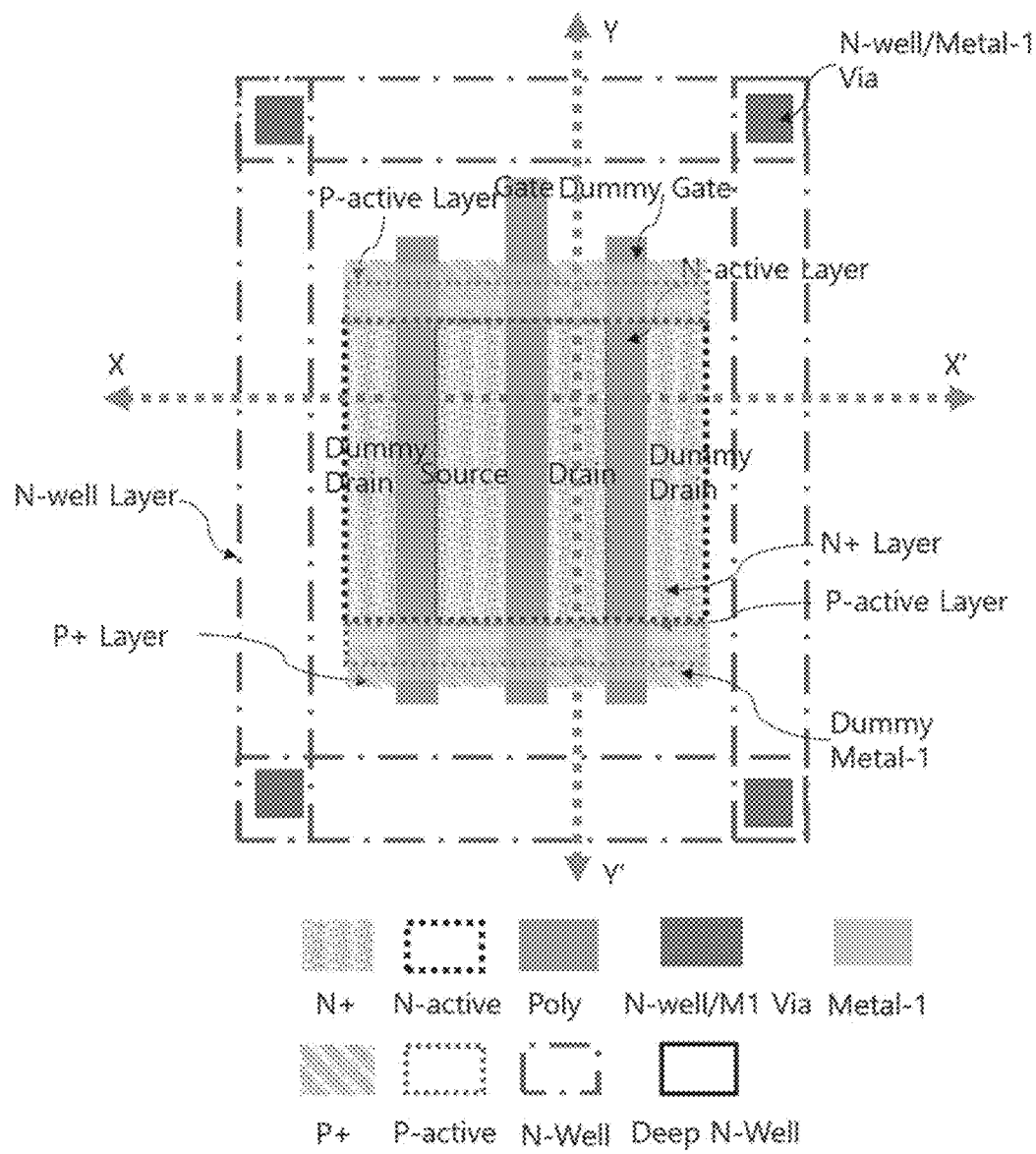
FIG. 13 is a view illustrating the layout of the radiation-tolerant unit MOSFET hardened against the single event effect and the total ionizing dose effect according to Embodiment 4 of the inventive concept.

FIG. 13 is a view illustrating the layout of the radiation-tolerant unit MOSFET hardened against the single event effect and the total ionizing dose effect according to Embodiment 4 of the inventive concept.

Figure 14A:
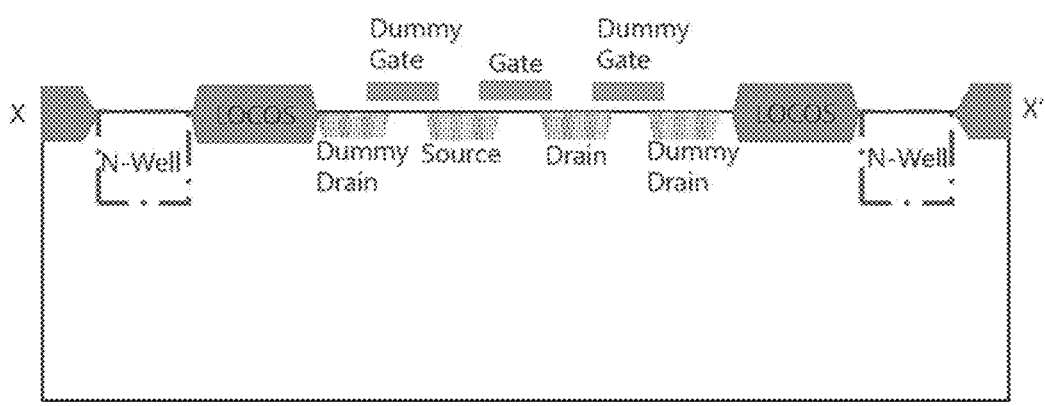
FIGS. 14A and 14B are sectional views taken along line X-X' and line Y-Y' of the layout of FIG. 13.
Figure 14B:
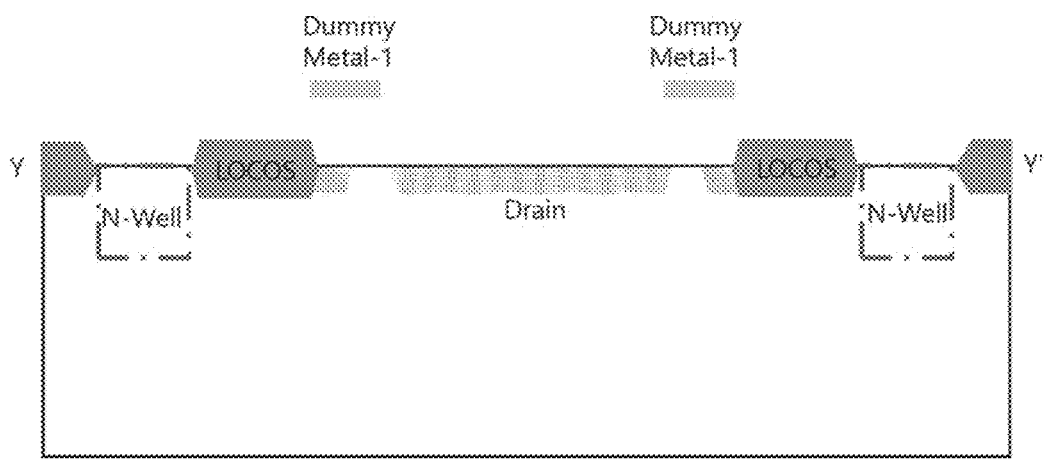

In addition, FIG. 14A is a sectional view taken along line X-X' of the layout of FIG. 13, and FIG. 14B is a sectional view taken along line Y-Y' of the layout of FIG. 13.

Referring to FIG. 13, Embodiment 4 is the case that the DD and the NW surrounding the unit MOSFET are applied.

In Embodiment 4, a voltage is separately applied through the N-well/Metal-1 via, so the current pulse generated due to the single event effect flows through the lateral side, thereby reducing the influence of the single event effect.

In Embodiment, 4, as recognized through Drain Current (DGA NMOS with DD and NW) marked in FIG. 16, although the current pulse generated due to the single event effect is greater than those of Embodiment 1 and Embodiment 3 and is less than that of Embodiment 2.

Embodiment 5

Figure 15A:
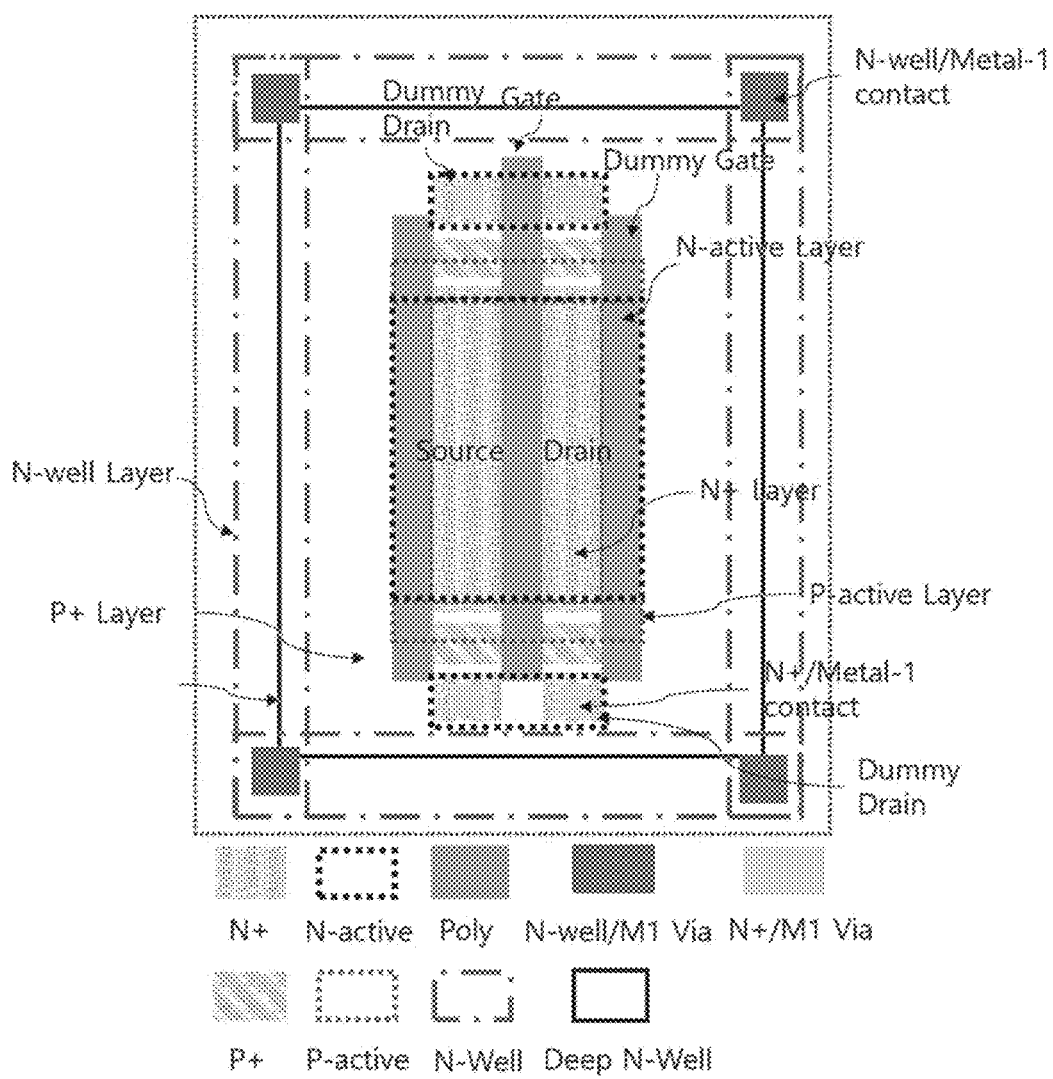
FIGS. 15A to 15C are views illustrating the layout of the radiation-tolerant unit MOSFET hardened against the single event effect and the total ionizing dose effect according to Embodiment 5 of the inventive concept.
Figure 15B:
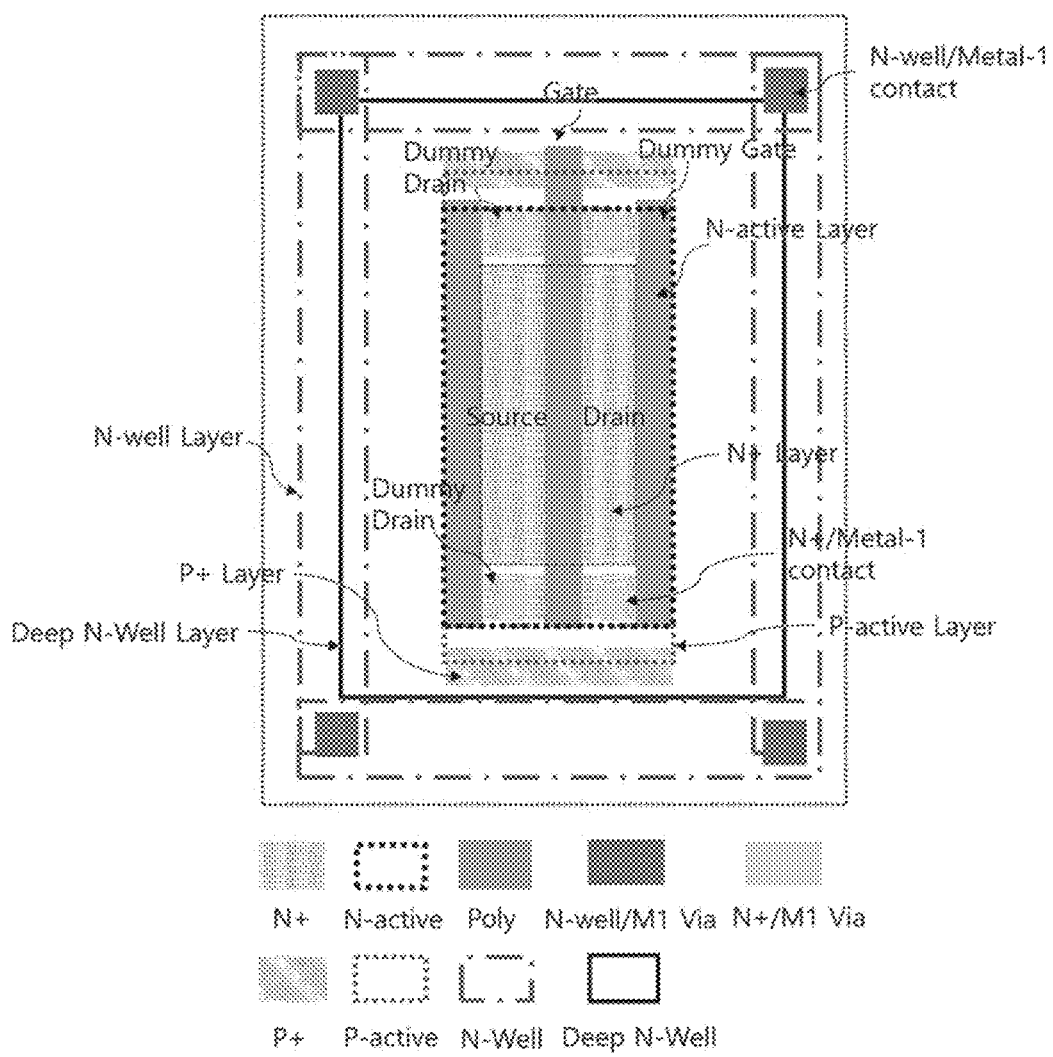
Figure 15C:
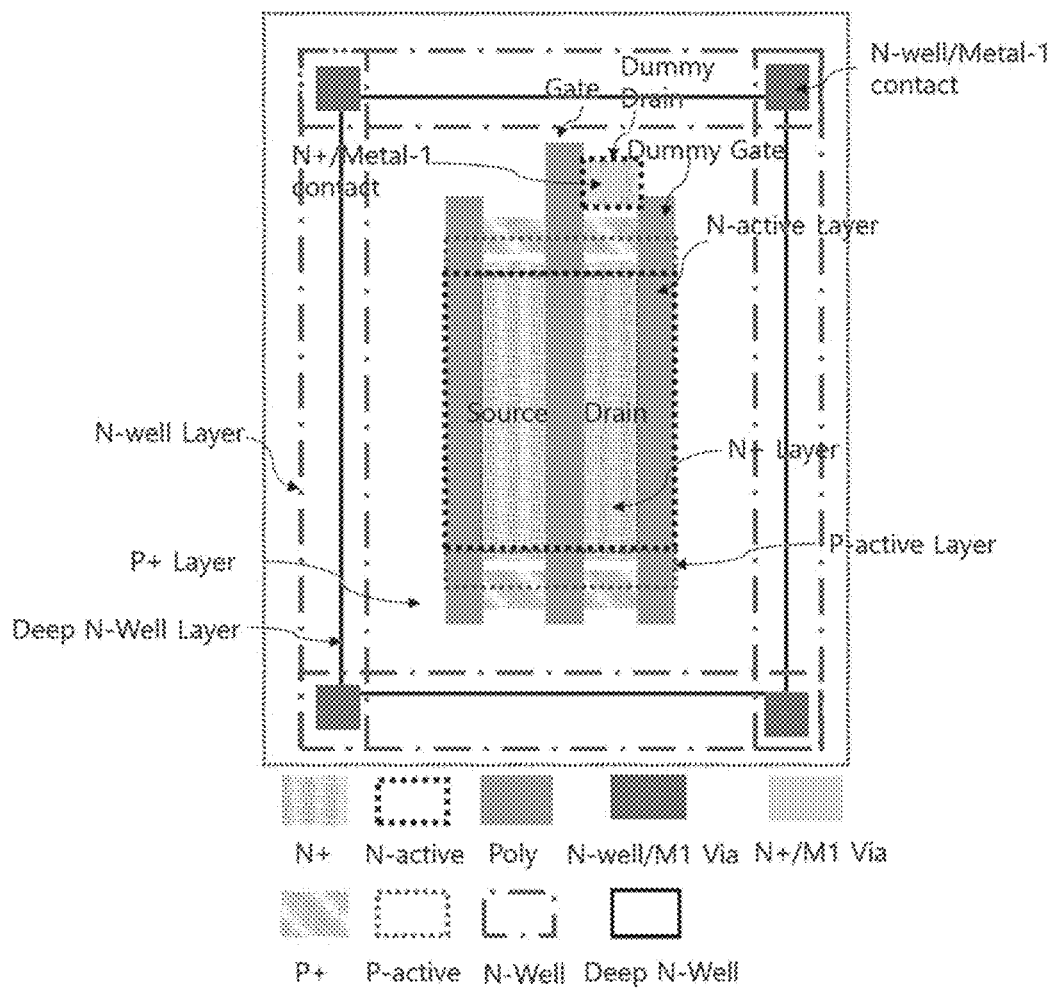

FIGS. 15A to 15C are views illustrating the layout of the radiation-tolerant unit MOSFET hardened against the single event effect and the total ionizing dose effect according to Embodiment 5 of the inventive concept;

In Embodiment 5 illustrated in FIGS. 15A to 15C, although all the DD, the DNW, and the NW are applied similarly to those of Embodiment 1, the DD is positioned at lateral sides over (at the top) or under (at the bottom) of the source and the drain.

In more detail, FIG. 15A is a view illustrating that the DD is positioned outside (or over) the P+ layer, FIG. 15B is a view illustrating that the DD is inside (or under) the P-active layer, and FIG. 15C is a view illustrating that the DD of FIG. 15A is positioned only at one side.

In this case, although FIG. 15C illustrates that the DD is positioned over (at the top) of the drain, the inventive concept is not limited thereto. The DD may be positioned at both sides or at one side of the top or the bottom of the source and the drain. When the DD is positioned at the one side, the DD may be positioned in at least any one of a right top, a left top, a left bottom, and a right bottom of the source and the drain.

In addition, the positions of the DD in Embodiment 2, Embodiment 3, and Embodiment 4 may be employed similarly to that of Embodiment 5.

Figure 17A:
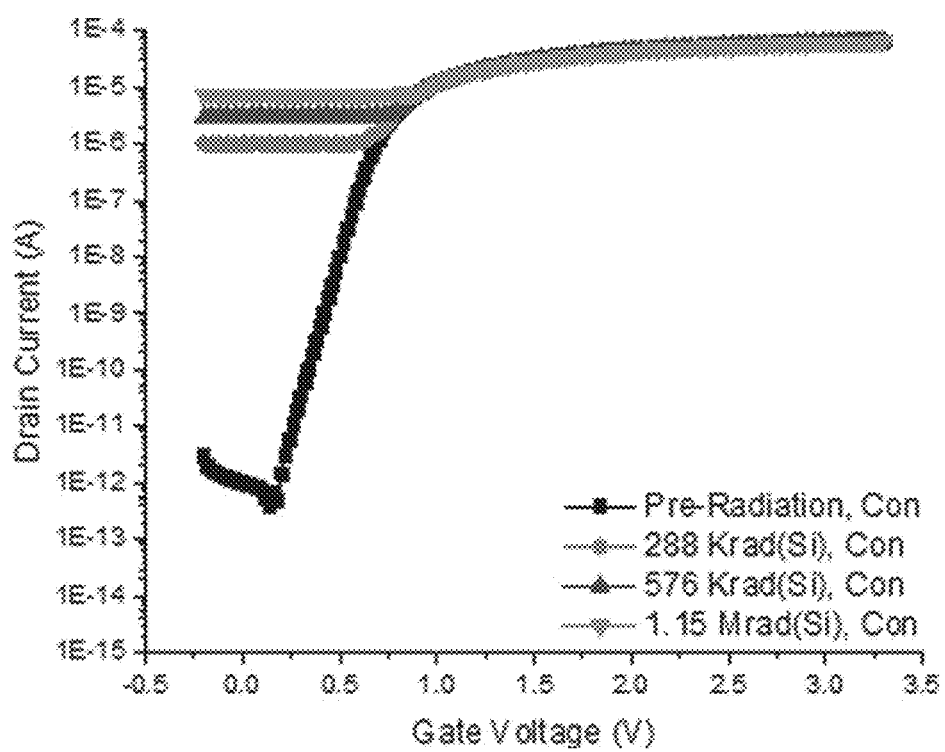
FIGS. 17A and 17B are graphs illustrating the results of a TID experiment as a gamma ray is irradiated.
Figure 17B:
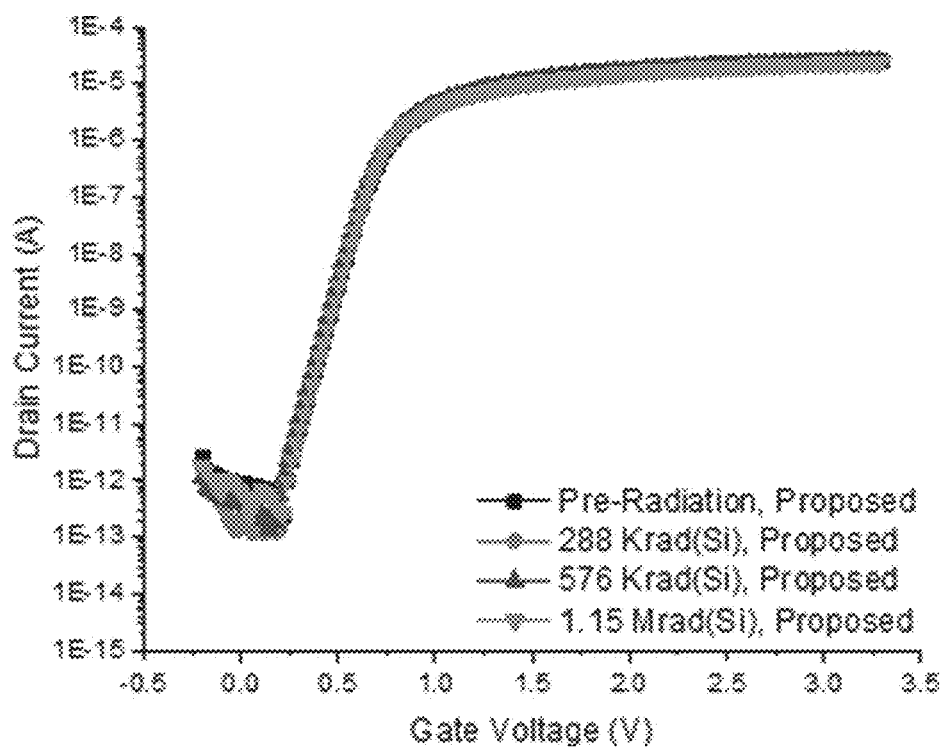

FIGS. 17A and 17B are graphs illustrating the results of a TID experiment as a gamma ray is irradiated.

In more detail, FIG. 17A illustrates the result of the TID experiment for a conventional unit MOSFET. FIG. 17B illustrates the result of the TID experiment for the radiation-tolerant unit MOSFET according to an embodiment of the inventive concept.

In this case, a voltage of 0.05 V is applied to the source and the drain.

Referring to FIGS. 17A and 17B, the suggested radiation-tolerant unit MOSFET of the inventive concept does not generate a leakage current even in the total ionizing dose of 1.15 Mrad (Si) as shown in the experiment result.

According to an embodiment of the inventive concept, the current pulse generated due to the single event effect may be dampened or blocked by using at least a portion of the layout including an N-active layer, an N+ layer, an N-well layer, a deep N-well layer, an N+/Metal-1 via, and an N-well/metal-1 via, thereby reducing the influence exerted on a circuit. Accordingly, the inventive concept may be utilized in designing an electronic part that may normally operate under a space which is a radiation environment where particle radiation and electromagnetic radiation are present, in exploration of other planets, or in a reactor of a nuclear power plant.

In addition, according to an embodiment of the inventive concept, the structure of damping or blocking the current pulse generated due to the single event effect is applied to the unit MOSFET using the conventional dummy gate, thereby fabricating a unit device hardened against the total ionizing dose effect and the single event effect.

In addition, according to an embodiment of the inventive concept, only a transistor layout is modified and applied to a commercial silicon process. Accordingly, additional processes such as a silicon on insulator (SOI) or a silicon on sapphire (SOS) are not required.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

The embodiments of the invention in which an exclusive property or privilege is claimed are defined as follows:

1. A radiation-tolerant unit metal-oxide field-effect transistor (MOSFET) for reducing an influence of a current pulse generated due to a single event effect, the radiation-tolerant MOSFET comprising:
   a poly gate layer for designating a gate region and at least one dummy gate region;
   a source and a drain;
   a dummy drain allowing application of a voltage;
   wherein the dummy drain distributes flow of electrons and holes produced by incident radiation; and
   wherein the dummy drain is connected with the poly gate layer and is positioned in each or both of lateral sides of the source and the drain.

2. The radiation-tolerant MOSFET of claim 1, wherein the radiation-tolerant MOSFET further comprises:
   a depletion region present between a deep N-well layer, and the dummy drain and the source and the drain of the transistor, and
   wherein the depletion region has a width adjusted by a voltage applied to the N-well layer.

3. The radiation-tolerant MOSFET of claim 1, wherein the radiation-tolerant MOSFET is formed through a layout modification technique.

4. The radiation-tolerant MOSFET of claim 1, wherein the radiation-tolerant MOSFET is implemented with a P-type metal oxide semiconductor (PMOS) including a PMOS gate electrode pattern or an N-type metal oxide semiconductor (NMOS) including an NMOS gate electrode pattern.

5. A radiation-tolerant unit metal-oxide field-effect transistor (MOSFET) for reducing an influence of a current pulse generated due to a single event effect, the radiation-tolerant MOSFET comprising:
   a poly gate layer for designating a gate region and at least one dummy gate region;
   a source and a drain; and
   a dummy drain allowing application of a voltage,
   wherein the dummy drain is positioned at a top or a bottom of the source and/or the drain.

6. A radiation-tolerant unit metal-oxide field-effect transistor (MOSFET) for reducing an influence of a current pulse generated due to a single event effect, the radiation-tolerant MOSFET comprising:
   a poly gate layer for designating a gate region and at least one dummy gate region;

a source and a drain; and a dummy drain allowing application of a voltage, wherein the radiation-tolerant unit MOSFET further comprises:

an N-well layer spaced apart from the dummy drain by a specific distance.

7. The radiation-tolerant unit MOSFET of claim 6, wherein the N-well layer is formed in length including lengths of the source and the drain and the dummy drain.

8. The radiation-tolerant unit MOSFET of claim 7, wherein the radiation-tolerant unit MOSFET further comprises:

an N-well/Metal-1 via configured to separately apply a voltage to the N-well layer.

9. The radiation-tolerant unit MOSFET of claim 8, wherein the N-well/Metal-1 via is positioned at each of overlapped regions with a plurality of the N-well layers formed at outer portions of the radiation-tolerant unit MOSFET.

10. The radiation-tolerant unit MOSFET of claim 6, wherein the radiation-tolerant unit MOSFET further comprises:

a deep N-well layer formed under the N-well layer.

11. The radiation-tolerant unit MOSFET of claim 10, wherein the deep N-well layer is formed under the N-well layer, the source and the drain, and the dummy drain, and is formed in length to cover N-well layers positioned at both sides of the gate region.

12. The radiation-tolerant MOSFET of claim 10, wherein the radiation-tolerant MOSFET distributes or blocks a current pulse generated due to the single event effect and flowing through the source and the drain of the transistor by using the N-well layer and the deep N-well layer positioned under the N-well layer.

13. A radiation-tolerant unit MOSFET including a poly gate layer for designating a gate region, an N+ layer for producing a source and a drain of a transistor, a dummy poly gate layer for blocking a leakage current path, and a P-active layer and a P+ layer for blocking a leakage current, to reduce an influence of a current pulse generated due to a single event effect, the radiation-tolerant unit MOSFET comprising:

a dummy drain allowing application of a voltage to the transistor, wherein the dummy drain makes contact with an outside of the P+ layer and an inner side of the P-active layer, and is positioned at a top or a bottom of the source and the drain.

14. A radiation-tolerant unit MOSFET including a poly gate layer for designating a gate region, an N+ layer for producing a source and a drain of a transistor, a dummy poly gate layer for blocking a leakage current path, and a P-active layer and a P+ layer for blocking a leakage current, to reduce an influence of a current pulse generated due to a single event effect, the radiation-tolerant unit MOSFET comprising:

a dummy drain allowing application of a voltage to the transistor, wherein the radiation-tolerant MOSFET distributes or blocks a current pulse generated due to the single event effect and flowing through the source and the drain by a deep N-well layer positioned under an N-well layer formed to be spaced apart from the radiation-tolerant MOSFET including the dummy drain by a specific distance.

15. The radiation-tolerant MOSFET of claim 14, wherein the radiation-tolerant MOSFET is implemented with an NMOS including an NMOS gate electrode pattern or a PMOS including a PMOS gate electrode pattern.

* * * * *